United States Patent
Gong et al.

(10) Patent No.: US 10,354,584 B2
(45) Date of Patent: Jul. 16, 2019

(54) DISPLAY DEVICE HAVING DOUBLE GATE TRANSISTORS

(71) Applicant: LG Display Co., Ltd., Seoul (KR)

(72) Inventors: Namyong Gong, Paju-si (KR); Sohee Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/806,806

(22) Filed: Nov. 8, 2017

(65) Prior Publication Data
US 2018/0144685 A1 May 24, 2018

(30) Foreign Application Priority Data
Nov. 23, 2016 (KR) .................... 10-2016-0156868

(51) Int. Cl.
*G09G 3/30* (2006.01)
*G09G 3/3233* (2016.01)
(Continued)

(52) U.S. Cl.
CPC ....... *G09G 3/3233* (2013.01); *H01L 27/3262* (2013.01); *G09G 2300/043* (2013.01); *G09G 2300/0417* (2013.01); *G09G 2300/0814* (2013.01); *G09G 2300/0819* (2013.01); *G09G 2300/0852* (2013.01); *G09G 2300/0861* (2013.01); *G09G 2310/0291* (2013.01); *G09G 2320/029* (2013.01); *G09G 2320/043* (2013.01); *G09G 2320/045* (2013.01); *G09G 2340/0435* (2013.01); *H01L 27/1225* (2013.01); *H01L 27/1251* (2013.01); *H01L 29/7869* (2013.01);
(Continued)

(58) Field of Classification Search
CPC ............... G09G 3/3225; G09G 3/3233; H01L 27/1225; H01L 27/1251; H01L 27/3262; H01L 29/78648; H01L 29/78672; H01L 29/7869
USPC ........................................ 345/76; 315/169.3
See application file for complete search history.

(56) References Cited

U.S. PATENT DOCUMENTS 6,627,953 B1 * 9/2003 Vu .................. A61B 3/113
257/347
2004/0174349 A1 * 9/2004 Libsch ................. G09G 3/3233
345/204
(Continued)

FOREIGN PATENT DOCUMENTS

JP 2003-224437 A 8/2003
JP 2009-063607 A 3/2009

OTHER PUBLICATIONS

Extended European Search Report dated Apr. 13, 2018, issued in corresponding European Patent Application No. 17202692.4.
(Continued)

*Primary Examiner* — Adam J Snyder
(74) *Attorney, Agent, or Firm* — Morgan, Lewis & Bockius LLP

(57) ABSTRACT

A display device is provided in which each subpixel includes a driving TFT, an organic light-emitting diode, and at least one switching TFT for driving the subpixel. At least one of the driving TFT and the switching TFT is formed as a double-gate TFT having a first gate node and a second gate node, and each subpixel comprises a compensation circuit that senses a threshold voltage of the double-gate TFT and applies the same to the first gate node or the second gate node of the double-gate TFT.

20 Claims, 17 Drawing Sheets

(51) Int. Cl.
  *H01L 27/32* (2006.01)
  *G09G 3/10* (2006.01)
  *H01L 27/12* (2006.01)
  *H01L 29/786* (2006.01)

(52) U.S. Cl.
  CPC .. *H01L 29/78648* (2013.01); *H01L 29/78672* (2013.01)

(56) References Cited

U.S. PATENT DOCUMENTS

| | | | | |
|---|---|---|---|---|
| 2010/0283054 | A1* | 11/2010 | Hirano | H01L 29/78603 257/57 |
| 2011/0273419 | A1* | 11/2011 | Park | G09G 3/30 345/211 |
| 2012/0146713 | A1* | 6/2012 | Kim | H01L 29/41733 327/530 |
| 2014/0168194 | A1* | 6/2014 | Kong | G09G 3/3233 345/212 |
| 2015/0084946 | A1* | 3/2015 | Shim | G09G 3/3258 345/212 |
| 2015/0187276 | A1* | 7/2015 | Shim | G09G 3/3233 345/77 |
| 2016/0042694 | A1* | 2/2016 | Lim | G09G 3/3233 345/78 |
| 2016/0093643 | A1* | 3/2016 | Jang | H01L 29/78648 257/43 |
| 2016/0240565 | A1 | 8/2016 | Kim et al. | |
| 2016/0300526 | A1* | 10/2016 | Lim | G09G 3/3233 |
| 2016/0307935 | A1* | 10/2016 | Han | H01L 27/1218 |

OTHER PUBLICATIONS

Communication pursuant to Article 94(3) EPC issued in corresponding European Patent Application No. 17 202 692.4, dated Nov. 19, 2018.

* cited by examiner

DISPLAY DEVICE HAVING DOUBLE GATE TRANSISTORS

This application claims the priority benefit of Korean Patent Application No. 10-2016-0156868 filed on Nov. 23, 2016, which is hereby incorporated herein by reference for all purposes as if fully set forth herein.

BACKGROUND

Technical Field

The present disclosure relates to a display device and a method of compensating for deterioration of the same, and more particularly, to a method of compensating for deterioration of elements of an electroluminescent display.

Discussion of the Related Art

An active-matrix electroluminescent display comprises self-luminous organic light-emitting diode (hereinafter, "OLED") or quantum dot emitting diode (hereinafter, "QLED"), and has the advantages of fast response time, high luminous efficiency, high luminance, and wide viewing angle.

Referring to FIG. 1, an OLED comprises an anode, a cathode, and organic compound layers formed between the anode and cathode. The organic compound layers comprise a hole injection layer EML, a hole transport layer HTL, an emission layer EML, and an electron transport layer ETL, and an electron injection layer EIL. When an operating voltage is applied to the anode and the cathode, a hole passing through the hole transport layer HTL and an electron passing through the electron transport layer ETL move to the emission layer EML, forming an exciton. Therefore, the emission layer EML generates visible light.

In an electroluminescent display, pixels each comprising an OLED are arranged in a matrix, and the luminance of the pixels is adjusted based on the grayscale of video data. Each individual pixel comprises a driving TFT (thin-film transistor) that controls the drive current flowing through the OLED based on a gate-source voltage, and at least one switching TFT for programming the gate-source voltage of the driving TFT, and adjusts the display's grayscale (luminance) by the amount of light emitted by the OLED, which is proportional to the drive current.

Electroluminescent displays are known for the technology which drives the pixels at low speeds to help lower power consumption if an input image changes only slightly. During slow driving, video data refreshes at longer intervals, the video data stored in the pixels may not be maintained at a target level but rather may leak. In the conventional slow driving technology, in order to reduce leakage of video data, some TFTs in each pixel may be configured as oxide TFTs with good off-current characteristics, and the other TFTs in each pixel may be configured as LTPS (Low Temperature Polysilicon) TFTs. For example, a TFT connected to a gate of the driving TFT is configured as an oxide TFT, and the other TFTs are configured as LTPS TFTs.

FIG. 2 illustrates a pixel circuit comprising an oxide TFT and LTPS TFTs. FIG. 3 illustrates the driving waveform of FIG. 2. Referring to FIGS. 2 and 3, a pixel PXL comprises an OLED (organic light-emitting diode), a plurality of TFTs (thin-film transistors) ST1 to ST3 and DT, and two capacitors Cst1 and Cst2. In FIG. 2, "Coled" denotes the parasitic capacitance of the OLED.

The TFTs ST1 to ST3 and DT are implemented as n-type MOSFETs (hereinafter, referred to as NMOS). For slow driving, the first switching TFT ST1 is configured as an NMOS oxide TFT with good off-current characteristics, and the other TFTs ST2, ST3, and DT are configured as NMOS LTPS TFTs with fast response characteristics.

The pixel PXL is driven through a scanning period and an emission period Te. The scanning period may be set to approximately 1 horizontal period 1H, and comprises a reset period Ti, a sensing period Ts, and a programming period Tw.

During the reset period Ti, a predetermined reference voltage Vref is supplied to data lines. During the reset period Ti, the voltage of a gate node Ng is reset to the reference voltage Vref, and the voltage of a source node Ns is reset to a predetermined reset voltage Vinit.

During the sensing period Ts, the electrical potential of the gate node Ng is maintained at the reference voltage Vref, whereas the electrical potential of the source node Ns rises with the drain-source current Ids. With this source-follower configuration, the gate-source voltage Vgs of the driving TFT DT is sampled as the threshold voltage Vth of the driving TFT DT, and the sampled threshold voltage Vth is stored in the first capacitor Cst1. Upon termination of the sensing period Ts, the voltage of the gate node Ng becomes equal to the reference voltage Vref, and the voltage of the source node Ns corresponds to the difference between the reference voltage Vref and the threshold voltage Vth.

During the programming period Tw, a data voltage Vdata is applied to the gate node Ng, and the voltage change Vdata−Vref at the gate node Ng is distributed across the capacitors Cst1 and Cst2, which is then reflected to the source node Ns. Thus, the gate-source voltage Vgs of the driving TFT DT is programmed to correspond to a desired drive current.

During the emission period Te, the OLED emits light by the drive current, thereby achieving a luminance for video data.

The electrical characteristics, such as threshold voltage, of these TFTs in the pixel circuit change with the passage of operating time. For this, there are various known ways to compensate the electrical characteristics of the LTPS TFTs.

However, in the case of a pixel circuit comprising two types of TFTs—that is, oxide TFTs and LTPS TFTs, new technology is needed to compensate for deterioration of the oxide TFTs because the electrical characteristics of the oxide TFTs are completely different from those of the LTPS TFTs.

SUMMARY

Accordingly, embodiments of the present disclosure are directed to a display device and a method of compensating for deterioration of the same that substantially obviate one or more of the problems due to limitations and disadvantages of the related art.

Features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device is provided in which each subpixel comprises a driving TFT, an organic light-emitting diode, and at least one switching TFT for driving the subpixel, wherein at least one of the driving TFT and the switching TFT is formed as a double-gate TFT having a first gate node and a second gate node, and each subpixel comprises a compensation circuit that senses a threshold voltage of the double-gate TFT and applies the threshold voltage to the first gate node or the second gate node of the double-gate TFT.

According to another aspect of the present disclosure, there is provided an electroluminescent display with an organic light-emitting diode in which each subpixel comprises: a driving TFT that applies drive current to the organic light-emitting diode to cause the organic light-emitting diode to emit light; a first switching TFT that is connected to a gate of the driving TFT and applies a data signal input through a data line to the gate of the driving TFT; and a plurality of switching TFTs that for turning on/off the driving TFT, wherein at least one of the driving TFT and the switching TFT is formed as a double-gate TFT having a first gate node and a second gate node, and each subpixel comprises a compensation circuit that senses the threshold voltage of the double-gate TFT and applies the same to the first gate node or second gate node of the double-gate TFT.

According to another aspect of the present disclosure, there is provided a method of compensating for deterioration of a display device in which each subpixel comprises a driving TFT, an organic light-emitting diode, and at least one switching TFT for driving the subpixel, the method comprising: turning off a first gate of a TFT whose threshold voltage is to be compensated so that the TFT operates as a source follower and the threshold voltage of the TFT is stored, the TFT whose threshold voltage is to be compensated is formed as a double-gate TFT having a first gate node and a second gate node; and applying the threshold voltage to a second gate of the TFT whose threshold voltage is to be compensated.

The details of one or more embodiments of the subject matter described in this specification are set forth in the accompanying drawings and the description below.

According to an embodiment of the present disclosure, a display device is effective for compensating the threshold voltage of a TFT configured to pixel circuit with a simple configuration.

According to an embodiment of the present disclosure, a deterioration of an oxide TFT can be compensated in a pixel circuit configured to include the oxide TFT.

According to an embodiments of the present disclosure, a TFT whose threshold voltage is to be compensated may be implemented as a double-gate TFT, in which one gate is connected to a capacitor for compensating threshold voltage, and a voltage charged to the capacitor is provided to a gate node of the TFT at regular time intervals, then it is possible to compensate the threshold of the TFT at regular time intervals.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
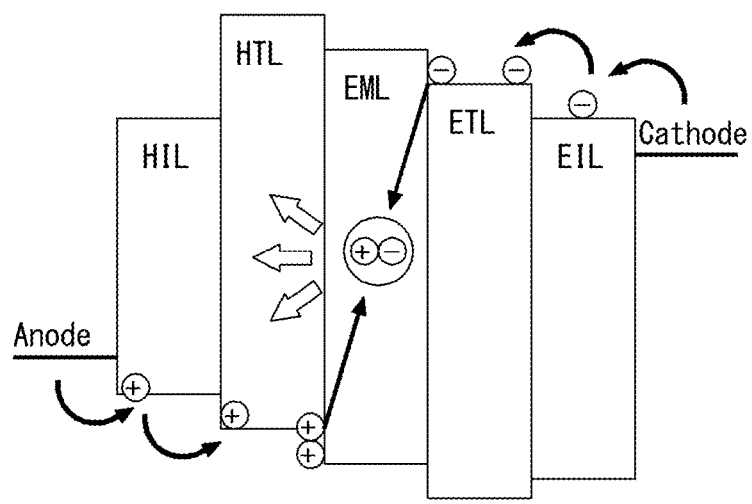
FIG. 1 is a view showing a general OLED structure.
Figure 2:
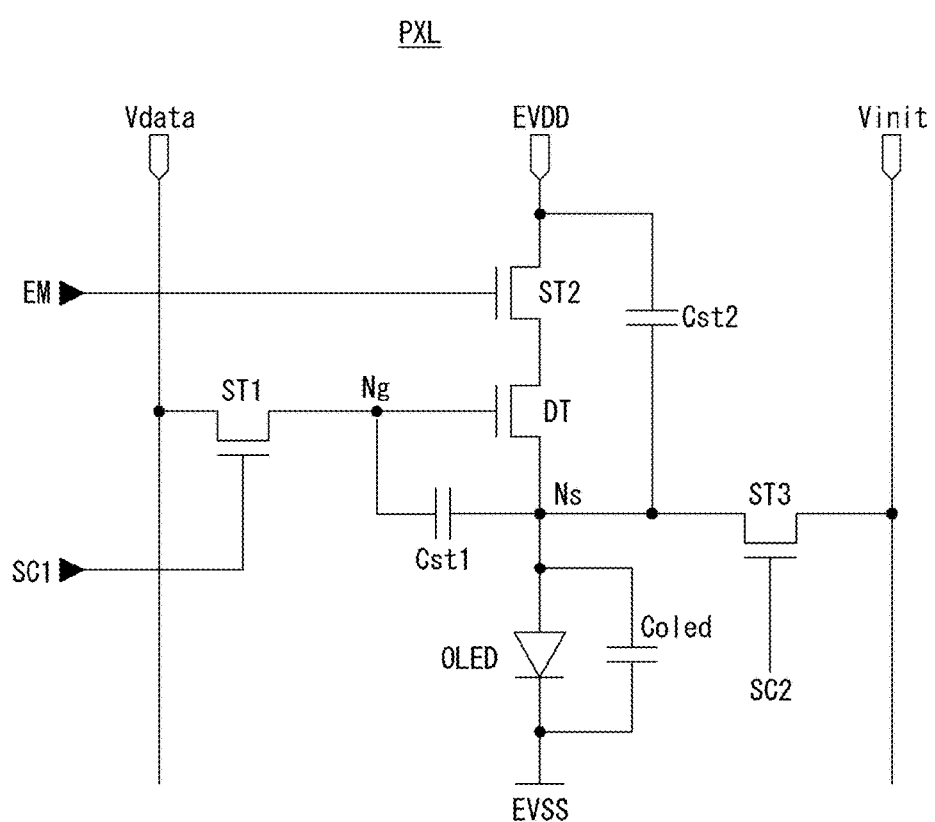
FIG. 2 is a view showing a pixel circuit comprising an oxide TFT and LTPS TFTs.
Figure 3:
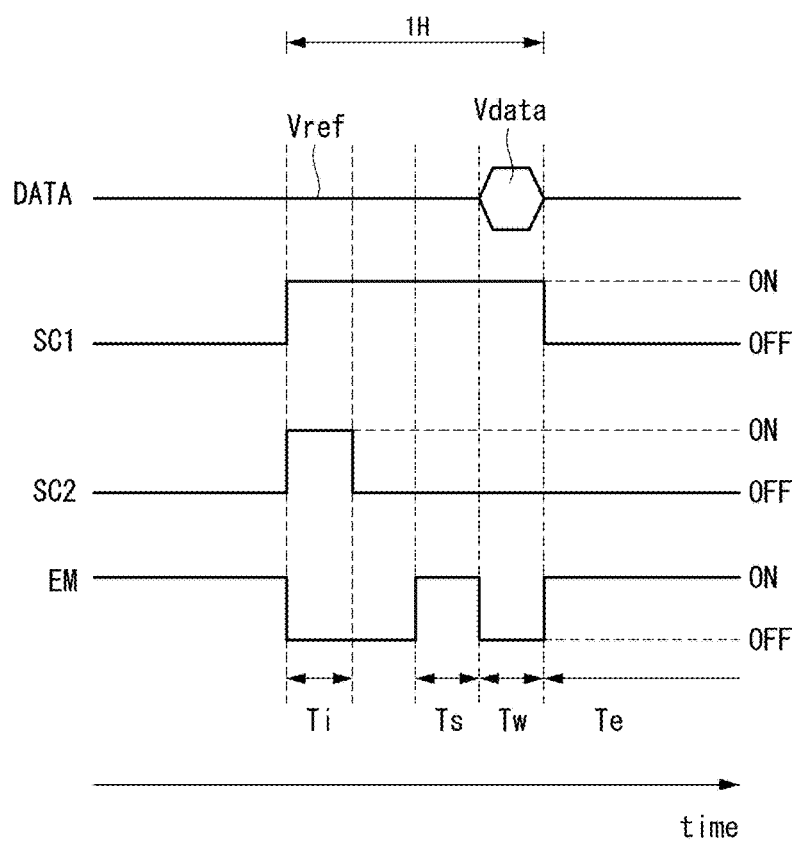
FIG. 3 is a view showing the driving waveform of FIG. 2.

Reference will now be made in detail to embodiments of the disclosure, examples of which are illustrated in the accompanying drawings.

The various aspects and features of the present disclosure and methods of accomplishing the same may be understood more readily by reference to the following detailed descriptions of embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'include' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

Like reference numerals denote like elements throughout the specification.

The features of various embodiments of the present disclosure may be combined with one another either partly or wholly, and may technically interact or work together in various ways. The embodiments may be carried out independently or in combination with one another.

Hereinafter, various embodiments of the present disclosure will be described in detail with reference to the accompanying drawings. Terms and names of elements used herein are chosen for ease of description and may differ from names used in actual products.

Figure 4:
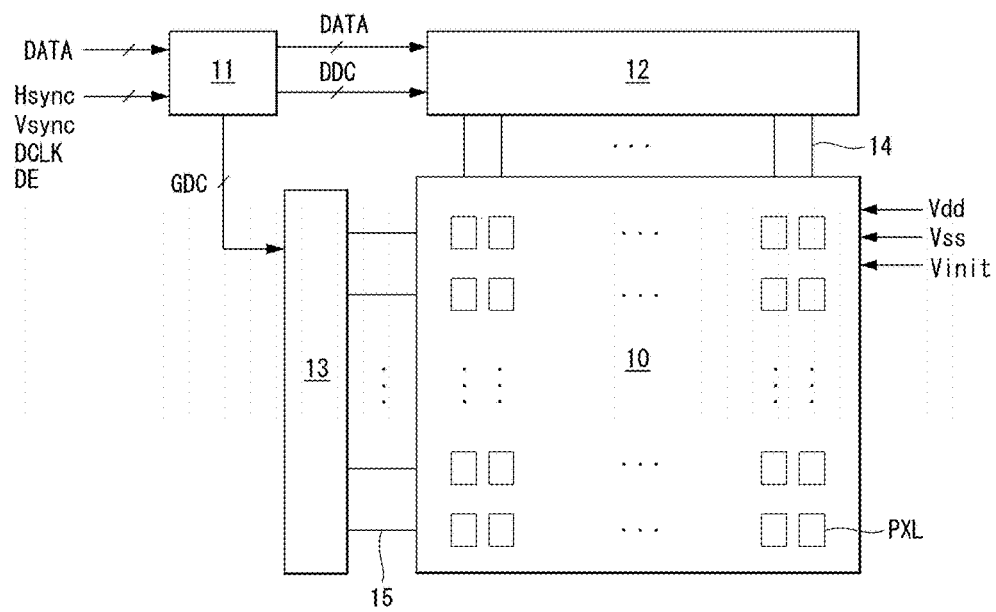
FIG. 4 is a block diagram showing an electroluminescent display according to an embodiment of the present disclosure.
Figure 5:
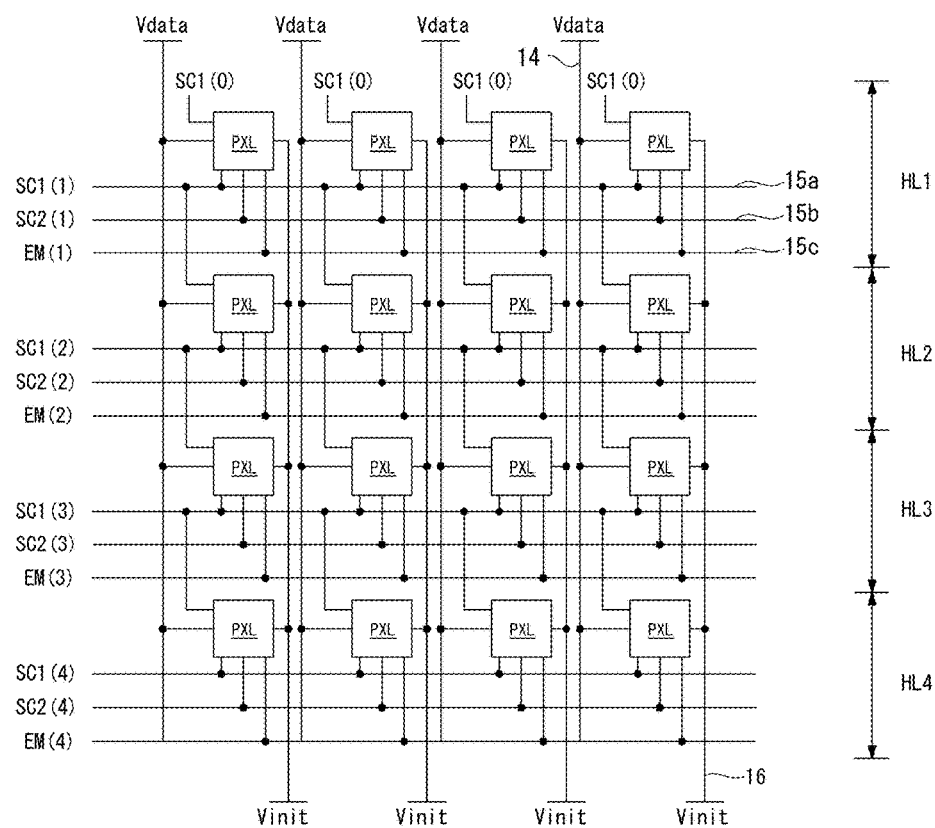
FIG. 5 is a view illustrating a pixel array according to the present disclosure.

FIG. 4 shows an electroluminescent display according to an embodiment of the present disclosure. FIG. 5 shows a pixel array according to the present disclosure.

Referring to FIGS. 4 and 5, an electroluminescent display according to the present disclosure comprises a display panel 10 with a plurality of pixels PXL, a display panel drive circuit that drives signal lines connected to the pixels PXL, and a timing controller 11 that controls the display panel drive circuit.

The display panel drive circuit 12 and 13 writes input video data DATA to the pixels PXL of the display panel 10. The display panel drive circuit comprises a source driver 12 that drives data lines 14 connected to the pixels PXL and a gate driver 13 that drives gate lines 15 connected to the pixels PXL.

The display panel drive circuit 12 and 13 may operate in slow driving mode. In slow driving mode, an input image is analyzed, and if the input image changes no more than a preset number of frames—that is, a still image is on for more than a certain amount of time, the operating frequency for running the display panel drive circuit 12 and 13 is lowered to lengthen the intervals at which data is written to the pixels PXL, thereby reducing power consumption. In slow driving mode, the refresh rate that video data DATA is updated on the display panel 10 is slower than in normal driving mode. In other words, when it is assumed that the operating frequency is M Hz in normal driving mode, the operating frequency in slow driving mode is lower than M Hz. Slow driving mode is not limited to when a still image is input. For instance, when the display device operates in standby mode or no user command or input image is input into the display panel drive circuit 12 and 13 for more than a predetermined amount of time, the display panel drive circuit 12 and 13 may operate in slow driving mode.

On the display panel 10, a plurality of data lines 14 and a plurality of gate lines 15 intersect each other, and the pixels PXL are disposed to display an image. A plurality of horizontal pixel lines HL1 to HL4 are provided on a pixel array of the display panel 10, and a plurality of horizontally neighboring pixels PXL connected commonly to gate lines 15 are disposed on each horizontal pixel line HL1 to HL4. The pixel array may further comprise a reset voltage supply line 16 for supplying a reset voltage Vinit to each pixel PXL, a Vdd supply line for supplying a high-level operating voltage Vdd to each pixel PXL, and a Vss supply line for supplying a low-level operating voltage Vss to each pixel PXL.

The gate lines 15 comprise a first gate line 15a for supplying a first scan signal SC 1, a second gate line 15b for supplying a second scan signal SC 2, and a third gate line 15c for supplying an emission signal EM. A first scan signal SC 1(n−1) allocated to an (n−1)th horizontal pixel line, as well as the first and second scan signals SC 1(n) and SC 2(n) and emission signal EM(n) allocated to the nth horizontal pixel line, may be further supplied to the pixels PXL disposed on an nth horizontal pixel line. To this end, the pixels PXL on a first horizontal pixel line HL1 may be connected commonly to a first gate line 15a for supplying a first scan signal SC 1(1), a second gate line 15b for supplying a second scan signal SC 2(1), and a third gate line 15c for supplying an emission signal EM(1), and are also connected commonly to a first gate line 15a on a 0th horizontal pixel line for supplying a first scan signal SC 1(0). Similarly, the pixels PXL on a fourth horizontal pixel line HL4 may be connected commonly to a first gate line 15a for supplying a first scan signal SC 1(4), a second gate line 15b for supplying a second scan signal SC 2(4), and a third gate line 15c for supplying an emission signal EM(4), and are also connected commonly to a first gate line 15a on a 3th horizontal pixel line HL3 for supplying a first scan signal SC 1(3).

Each pixel PXL may be either a red subpixel, a green subpixel, a blue subpixel, or a white subpixel to produce a color. One data line 14, one reset voltage supply line 16, one first gate line 15a, one second gate line 15b, one third gate line 15c, the Vdd supply line, and the Vss supply line may be connected to each pixel PXL.

In normal driving mode, the source driver 12 converts input video data DATA received from the timing controller 11 to a data voltage Vdata in each frame, and then supplies the data voltage Vdata to the data lines 14. The source driver 12 outputs a data voltage Vdata by using a digital-to-analog converter (hereinafter, "DAC") for converting input video data DATA to a gamma compensation voltage. In slow driving mode, the operating frequency of the source driver 12 is lowered under control of the timing controller 11. For example, in normal driving mode, the source driver 12 outputs a data voltage Vdata for video data at 1-frame intervals, whereas, in slow driving mode, the source driver 12 may output a data voltage Vdata for video data at intervals of several frames and be idle in some frames (that is, the outputting of the data voltage Vdata may be interrupted). Accordingly, the operating frequency and power consumption of the source driver 12 are significantly lowered compared to normal driving mode.

A multiplexer may be further disposed between the source driver 12 and the data lines 14 of the display panel 10. The multiplexer may reduce the number of output channels of the source driver 12 relative to the number of data lines by distributing a data voltage output from the source driver 12 via one output channel across a plurality of data lines. The multiplexer may be omitted depending on the resolution and use of the display device.

The source driver 12 may generate a reset voltage Vinit and supply it to the reset voltage supply lines 16, generate a high-level operating voltage Vdd and supply it to the Vdd supply line, and generate a low-level operating voltage Vss and supply it to the Vss supply line. To this end, the source driver 12 may further comprise a power generator. The power generator may be mounted outside the source driver 12 and then electrically connected to the source driver 12 through a conductive film or the like. To prevent unnecessary light emission from the OLED, the reset voltage Vinit may be chosen to be lower than the low-level operating voltage Vss.

The gate driver 13 outputs scan signals SC 1 and SC 2 under control of the timing controller 11 to select pixels PXL to charge with a data voltage. The gate driver 13 may be implemented as a shift register to shift the first scan signal SC 1, thereby sequentially supplying the first scan signal SC 1 to the first gate lines 15a. Also, the gate driver 13 may be implemented as a shift register to shift the second scan signal SC 2, thereby sequentially supplying the second scan signal SC 2 to the second gate lines 15b.

The gate driver 13 outputs an emission signal EM under control of the timing controller 11 to control the light emission timing of each pixel PXL. The gate driver 13 may comprise a shift register and an inverter to shift the emission signal EM, thereby sequentially supplying the signals to the gate lines 15c.

The gate driver 13, along with the pixel array, may be formed directly on a substrate of the display panel 10 according to the GIP (gate-driver-in-panel) technology, but not limited to it. The gate driver 13 may be manufactured as IC type, and then bonded to the display panel 10 through a conductive film.

The timing controller 11 receives data DATA of an input image from a host system and a timing signal synchronized with the digital data DATA. The timing signal comprises a vertical synchronization signal Vsync, a horizontal synchronization signal Hsync, a dot clock signal DCLK, and a data enable signal DE. The host system may be implemented as any one of the following: a television system, a set-top box, a navigation system, a DVD player, a Blue-ray player, a personal computer PC, a home theater system, and a phone system.

The timing controller 11 may comprise a slow driving control module that varies the operating frequency of the display panel drive circuit 12 and 13. As mentioned above, it should be noted that slow driving mode is not limited to still images.

In normal driving mode, the timing controller 11 may control the operation timing of the display panel drive circuit 12 and 13 to a frame frequency of (input frame frequency×i) Hz (i is a positive integer greater than 0), which is equal to i multiples of the input frame frequency. The input frame frequency is 60 Hz in the NTSC (National Television Standards Committee) system and 50 Hz in the PAL (Phase-Alternating Line) system. In slow driving mode, the timing controller 11 may lower the operating frequency of the display panel drive circuit 12 and 13. For example, the timing controller 11 may lower the operating frequency of the display panel drive circuit 12 and 13 to about 1 Hz so that video data DATA is written to the pixels PXL at 1-second intervals. The frequency for slow driving mode is not limited to 1 Hz. In slow driving mode, the pixels PXL of the display panel 10 are not charged with a new data voltage during most of the time of 1 frame, but the charged data voltage may be maintained.

The timing controller 11 generates data timing control signals DDC for controlling the operation timing of the source driver 12 and gate timing control signals GDC for controlling the operation timing of the gate driver 13, on the basis of timing signals Vsync, Hsync, and DE received from the host system. The timing control signals DDC and GDC generated by the timing controller 11 may be different in normal driving mode and in slow driving mode.

The data timing control signals DDC comprise a source start pulse, a source sampling clock, a source output enable signal SOE, etc. The source start pulse controls the sampling start timing of the source driver 12. The source sampling clock is a clock for shifting the data sampling timing. If the signaling interface between the timing controller 11 and the source driver 12 is a mini LVDS (Low Voltage Differential Signaling) interface, the source start pulse and the source sampling clock may be omitted.

The gate timing control signals GDC comprise a gate start pulse, a gate shift clock, an emission shift clock, a gate output enable signal, etc. In the case of a GIP circuit, the gate output enable signal may be omitted. The gate start pulse is generated at an initial stage of each frame period and input into the shift register. The gate start pulse controls the start timing for outputting scan signals SC 1 and SC 2 and an emission signal EM in every frame period. The gate shift clock is input into the shift register of the gate driver 13 and controls the shift timing of the shift register. The emission shift clock is input into the inverter of the gate driver 13 and controls the shift timing of the inverter.

A pixel PXL of the electroluminescent display according to the present disclosure may comprise oxide TFTs with good off-current characteristics and LTPS (Low Temperature Polysilicon) TFTs with fast response characteristics. For instance, a TFT connected to a gate of a driving TFT may be configured as an oxide TFT, and the other TFTs may be configured as LTPS TFTs.

The oxide TFTs may comprise N-type oxide TFTs and P-type oxide TFTs. The LTPS TFTs also may comprise N-type LTPS TFTs and P-type LTPS TFTs. Accordingly, a pixel PXL to which the present disclosure is applied may comprise a variety of combinations of TFTs, as shown in the following [Table 1].

TABLE 1

|   | Oxide TFT | LTPS |
|---|-----------|------|
| 1 | N-Type    | N-Type |
| 2 | N-Type    | P-Type |
| 3 | P-Type    | N-Type |
| 4 | P-Type    | P-Type |

The pixel PXL to which the present disclosure is applied comprises a driving TFT for adjusting the current flowing through the OLED according to a gate voltage, a switching TFT connected to the gate of the driving TFT, and other TFTs for driving the pixel PXL. The driving TFT and the switching TFT are important elements needed for normal driving of the pixel PXL. The driving TFT and the switching TFT both may be implemented as an oxide TFT or an LTPS TFT. For example, the switching TFT may be implemented as an oxide TFT with good off-current characteristics, and the driving TFT may be implemented as an LTPS TFT with fast response characteristics or may be implemented as an oxide TFT depending on the design. The combinations of the driving TFT and switching TFT of the pixel PXL to which the present disclosure is applied may comprise a variety of combinations of TFTs, as shown in the following [Table 2].

TABLE 2

| | Switching TFT | D-TFT |
|---|---|---|
| 1 | LTPS | LTPS |
| 2 | Oxide | LTPS |
| 3 | Oxide | Oxide |

As above, the pixel circuit PXL may comprise various substrates and a combination of various types of TFTs.

The present disclosure discloses a technology for compensating the threshold voltage of a TFT with a simple configuration, in which a pixel circuit PXL can have various TFT configurations. According to an embodiment of the present disclosure, a TFT whose threshold voltage is to be compensated may be implemented as a double-gate TFT, in which one gate is used for driving the pixel PXL and the other gate is applied with a voltage for threshold voltage compensation. The threshold voltage compensation is achieved by sensing and storing the threshold voltage of the double-gate TFT. The sensed threshold voltage may be stored in a capacitor connected to one gate node of the double-gate TFT at regular intervals and supplied to the double-gate TFT through the gate node. By connecting a power supply for compensation to a gate of the double-gate TFT, the threshold voltage of this TFT is shifted in the reverse direction of the characteristic curve, thereby compensating the threshold voltage. With this circuit configuration, the threshold voltage of an oxide TFT in the pixel PXL too can be adjusted easily.

A first embodiment of the present disclosure illustrates that a switching TFT is configured as a double-gate TFT to compensate threshold voltage. FIGS. 6 to 11 are views related to the first embodiment of the present disclosure. The first embodiment of the present disclosure will be explained on the assumption that the switching TFT is configured as an NMOS-type oxide TFT with good off-current characteristics and the other TFTs including a driving TFT are configured as NMOS-type LTPS TFTs with fast response characteristics.

Figure 6:
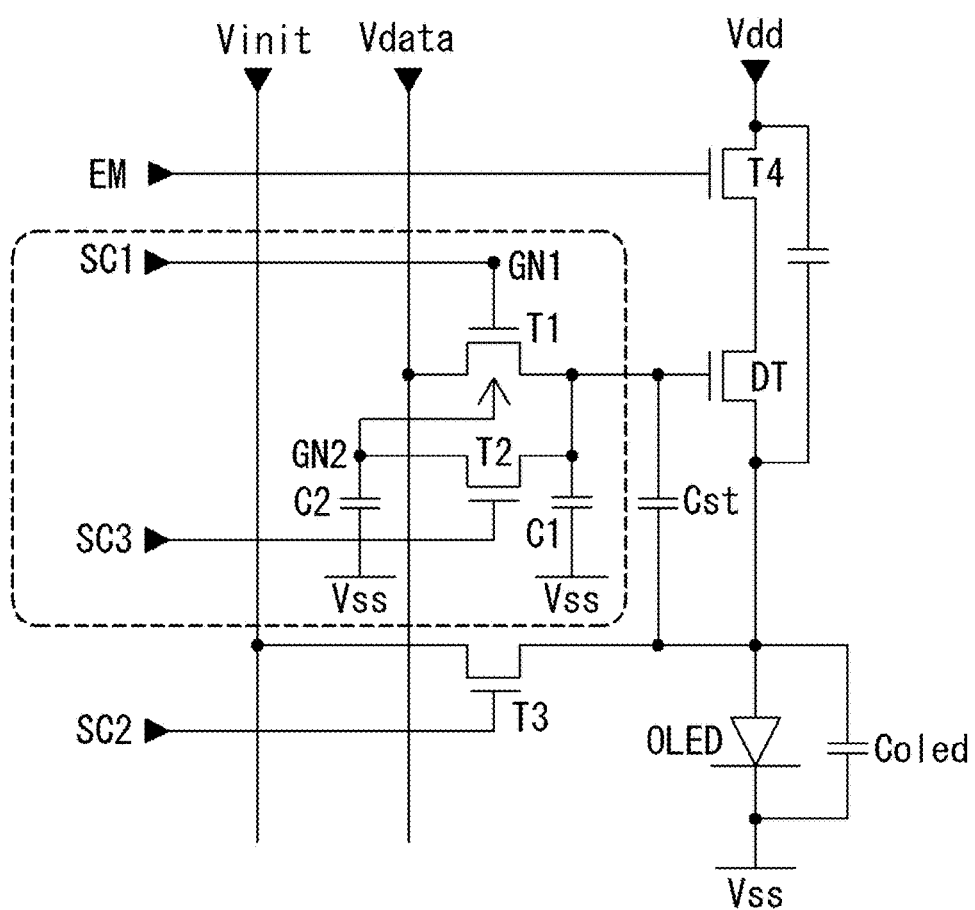
FIG. 6 is a view showing a connection configuration of a pixel according to a first embodiment of the present disclosure.
Figure 7:
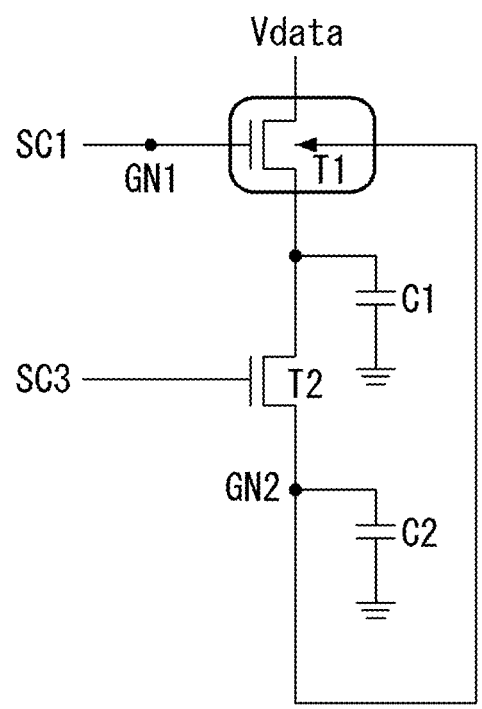
FIG. 7 is a view illustrating an equivalent circuit of a circuit for compensating the threshold voltage of a first switching TFT in the pixel of FIG. 6.
Figure 8:
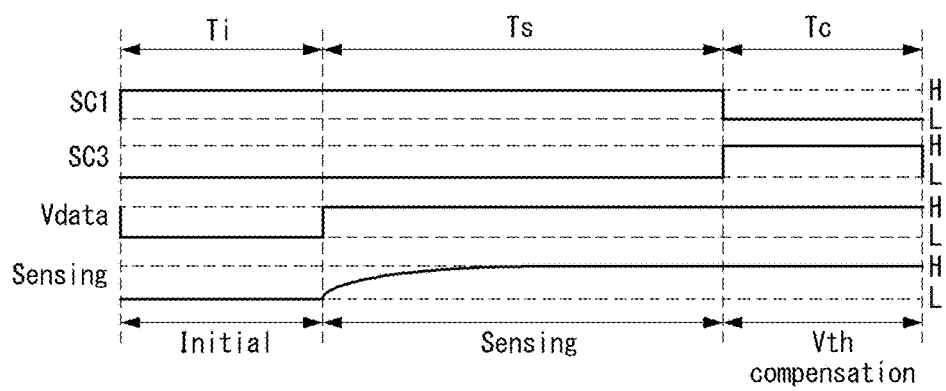
FIG. 8 is a view illustrating driving signals which are input to compensate the threshold voltage of the first switching TFF in the pixel of FIG. 6.

FIG. 6 is a view showing a connection configuration of a pixel PXL according to the first embodiment of the present disclosure. FIG. 7 is a view illustrating an equivalent circuit of a compensation circuit for compensating the threshold voltage of a first switching TFT T1 in the pixel configuration of FIG. 6. FIG. 8 is a view illustrating driving signals which are input to compensate the threshold voltage of the first switching TFT T1 in the pixel configuration of FIG. 6.

Referring to FIGS. 6 and 7, the pixel PXL of this disclosure comprises an organic light-emitting diode OLED, a plurality of TFTs (thin-film transistors) T1 to T4 and DT, and capacitors C1, C2, Cst, and Coled.

The first switching TFT T1 may be implemented as an oxide TFT with good off-current characteristics. By implementing the first switching TFT T1 as an oxide TFT, a change in the electrical potential of the gate node caused by leakage current in slow driving mode may be suppressed as much as possible. The other TFTs DT and T2 to T4 may be implemented as LTPS TFTS, thereby achieving desired response characteristics.

The first switching TFT T1, whose threshold voltage is to be compensated, may be implemented as a double-gate TFT having a first gate node GN1 and a second gate node GN2.

More generally speaking, the first embodiment comprises a plurality of TFTs, at least one of which is configured as a double-gate TFT. This technical feature may apply to modifications of this embodiment.

The first gate node GN1 of the first switching TFT T1 is connected to a first scan line to which a first scan signal SC 1 is applied. The drain of the first switching TFT T1 is connected to a data line to which a data voltage Vdata is applied and the source of the first switching TFT T1 is connected to a gate of the driving TFT DT.

The first switching TFT T1 applies a data voltage Vdata input through the data line to the gate of the driving TFT DT in response to the first scan signal SC 1 input into the first gate node GN1.

The driving TFT DT adjusts the current flowing through the OLED according to a gate voltage. A high-level power supply voltage Vdd is applied to the drain of the driving TFT DT. The source of the driving TFT DT is connected to the anode of the OLED. A third TFT T3 connects an initial line to which a reset voltage Vinit is applied and the anode of the OLED in response to a second scan signal SC 2.

For threshold voltage compensation of the first switching TFT T1, the source of the first switching TFT T1 is connected to a first capacitor C1 that stores threshold voltage Vth of the first switching TFT T1, and the second gate node GN2 of the first switching TFT T1 is connected to a second capacitor C2 that stores threshold voltage Vth.

A connection line of the first capacitor C1 and the second capacitor C2 may be connected or disconnected by a second switching TFT T2 that turns on/off by a third scan signal SC 3, whereby the threshold voltage Vth stored in the first capacitor C1 may move to the second capacitor C2 and be stored in it.

The threshold voltage compensation process may be implemented through a reset period Ti, a sensing period Ts subsequent to the reset period Ti, and a compensation period Tc subsequent to the sensing period Ts, as illustrated in FIG. 8.

In the reset period Ti, the first scan signal SC 1 is input at high level H, and the third scan signal SC 3 and the data voltage Vdata are input at low level L.

In the sensing period Ts, the first scan signal SC 1 is input at high level H, the third scan signal SC 3 is input at low level L, and the data voltage Vdata is input at high level H. The sensing waveform is an illustration of the waveform of the threshold voltage Vth stored in the first capacitor C1.

In the compensation period Tc, the first scan signal SC 1 is input at low level L, the third scan signal SC 3 is input at high level H, and the data voltage Vdata is input at high level H.

Here, the high level H is a voltage level that turns on NMOS-type oxide TFTs and at the same time turns off PMOS-type LTPS TFTs. On the other hand, the low level L is a voltage level that turns off NMOS-type oxide TFTs and at the same time turns on PMOS-type LTPS TFTs.

The above threshold voltage compensation process may be performed at regular intervals set at the time of system design. For instance, this process may be performed at intervals of a specific number of frames, when turning on/off the display device, or at regular time intervals.

Figure 9:
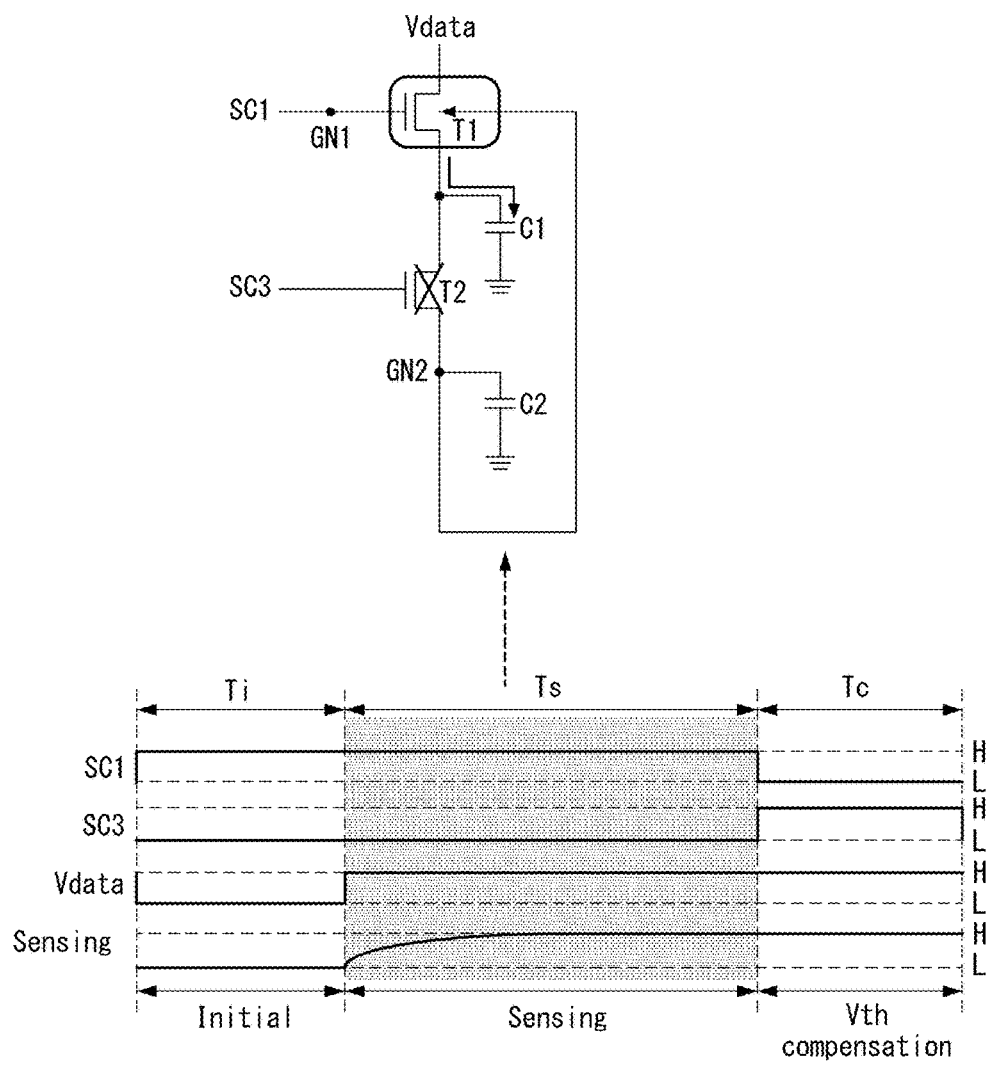
FIG. 9 is an equivalent circuit diagram of how the pixel works during the sensing period of FIG. 8.
Figure 10:
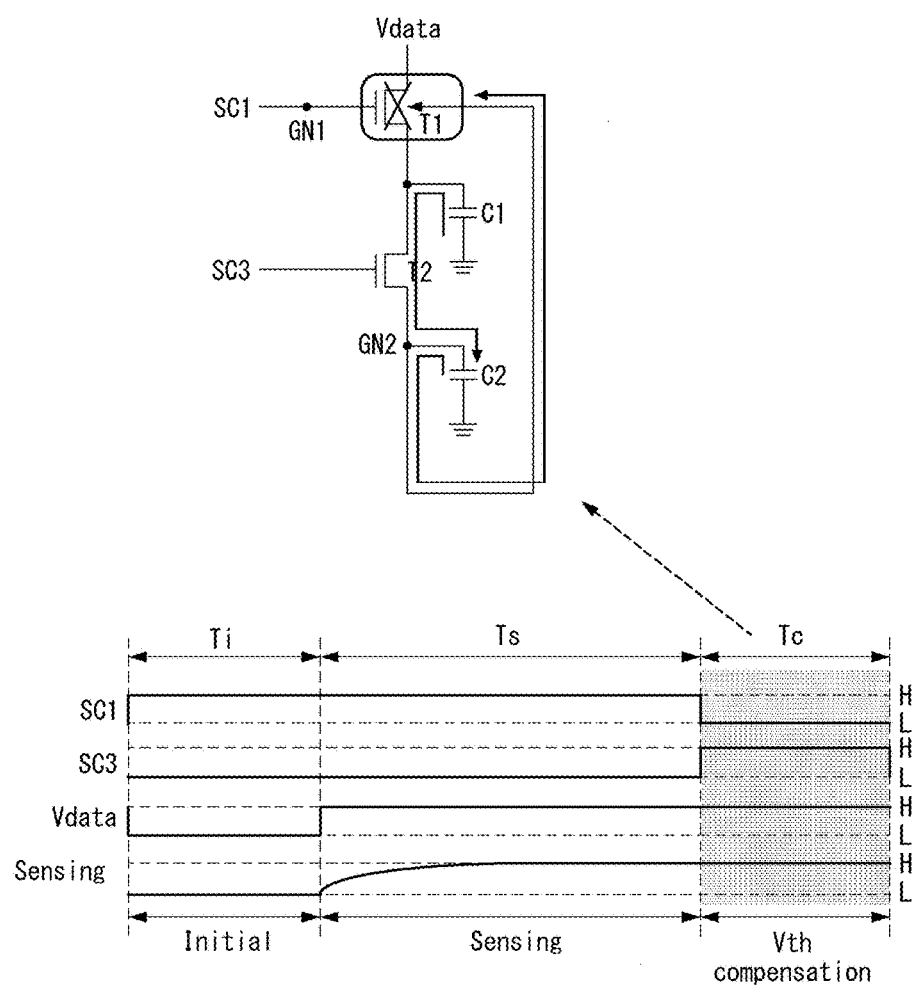
FIG. 10 is an equivalent circuit diagram of how the pixel works during the compensation period of FIG. 8.

FIGS. 9 and 10 are equivalent circuit diagrams of how the pixel PXL works during the reset period Ti, sensing period Ts, and compensation period Tc of FIG. 8.

In the reset period Ti, the first switching TFT T1 turns on as the first scan signal SC 1 is input at high level H. The second switching TFT T2 turns off as the third scan signal SC3 is input at low level L. The data voltage Vdata, input from the data line to which the drain of the first switching TFT T1 is connected, is input at low level L, too. Thereby resetting the power stored in the capacitor C1 and second capacitor C2.

Referring to FIG. 9, in the sensing period Ts, the first switching TFT T1 turns on as the first scan signal SC 1 is input at high level H. The second switching TFT T2 turns off as the third scan signal SC 3 is input at low level L. Here, the data voltage Vdata, input from the data line of the first switching TFT T1, is input at high level H.

Therefore, the data voltage Vdata is applied from the data line to the source node of the first switching TFT T1, The first switching TFT T1 operates as a source follower, and threshold voltage Vth is sensed and stored in the first capacitor C1.

In detail, when the data voltage Vdata, higher than the reset voltage, is applied to the source node of the first switching TFT T1, current flows through the first switching TFT Ti. Due to this current, the electrical potential of the first capacitor C1 is rising. When the electrical potential of the gate-source voltage of the first switching TFT T1 becomes equal to the threshold voltage Vth of the first switching TFT T1, and the first switching TFT T1 turns off. At the point in time when the first switching TFT T1 turns off, the electrical potential of the first capacitor C1 is stored as the threshold voltage Vth of the first switching TFT Ti.

Referring to FIG. 10, in the compensation period Tc, the first switching TFT T1 turns off as the first scan signal SC 1 is input at low level L. The second switching TFT T2 turns on as the third scan signal SC3 is input at high level H.

Therefore, the threshold voltage Vth stored in the first capacitor C1 moves to the second capacitor C2 through the second switching TFT T2. After moving to the second capacitor C2, the threshold voltage Vth is input into the second gate node GN2 of the first switching TFT T1, thereby compensating the threshold voltage of the first switching TFT Ti.

Figure 11:
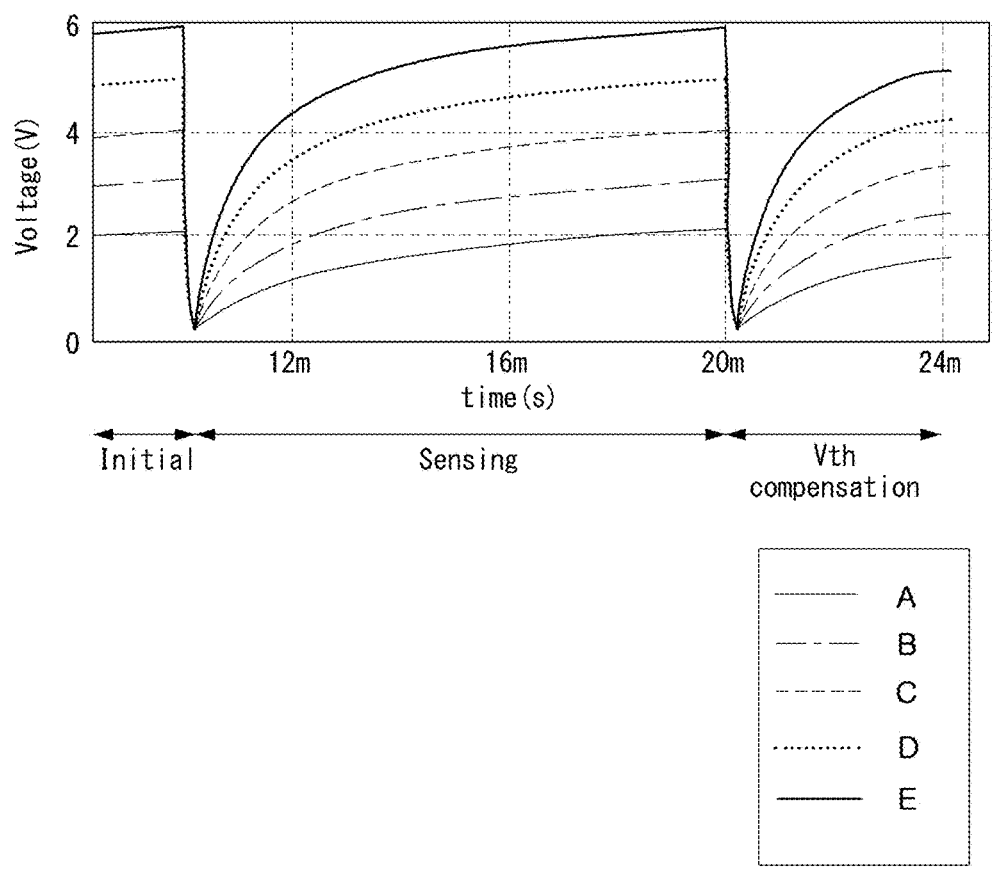
FIG. 11 is a graph of the results of a simulation of the threshold voltage stored in the first capacitor (C1) according to the threshold voltage characteristic of the first switching TFT which is compensated according to the driving signals of FIG. 6.

FIG. 11 is a graph of the results of a simulation of the threshold voltage (Vth) stored in the first capacitor (C1) according to the threshold voltage characteristic of the first switching TFT which is compensated according to the driving signals of FIG. 6.

As illustrated in FIG. 11, in the reset period Ti, a voltage stored in the first capacitor (C1) is reset, and in the sensing period Ts, the threshold voltage Vth is stored in the first capacitor C1. As shown in the graph, when the threshold voltage characteristics of the first switch TFT are different from each other by A to E, the threshold voltage (Vth) stored in the first capacitor (C1) is also detected and stored differently. Afterwards, in the compensation period Tc, the threshold voltage Vth stored in the first capacitor C1 is delivered to the second capacitor C2 and input into the second gate node GN2 of the first switching TFT T1. As such, the threshold voltage of the first switching TFT T1 may be compensated by an amount equal to the threshold voltage Vth applied to the second gate node GN2.

A second embodiment of the present disclosure illustrates that a driving TFT is configured as a double-gate TFT to compensate threshold voltage. FIGS. 12 to 16 are views related to the second embodiment of the present disclosure. The second embodiment of the present disclosure will be explained on the assumption that both a switching TFT and the driving TFT are configured as NMOS-type oxide TFTs.

Figure 12:
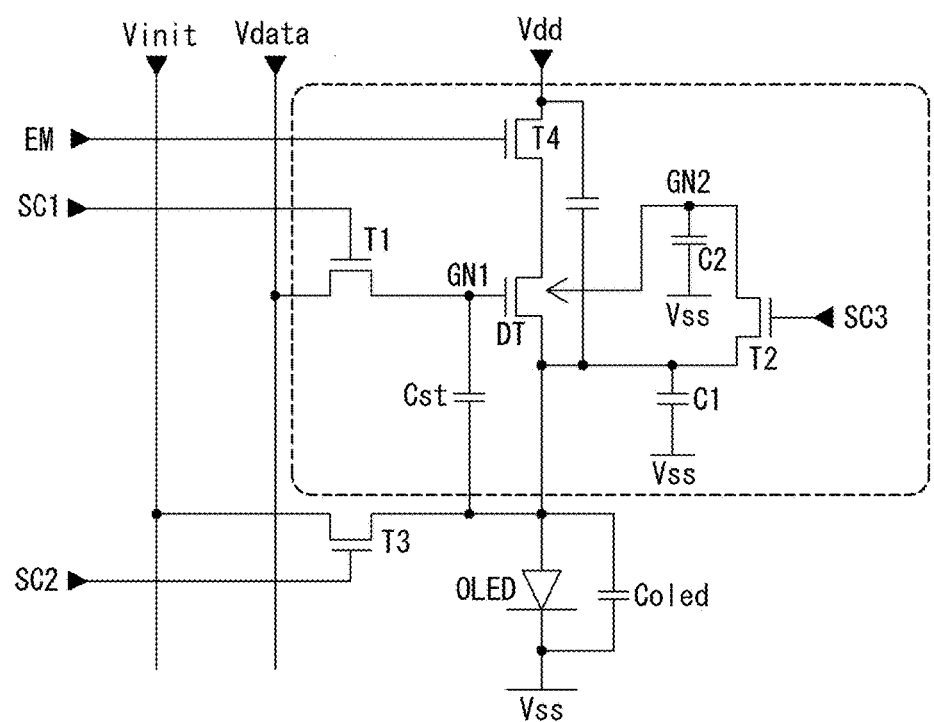
FIG. 12 is a view showing a connection configuration of a pixel according to a second embodiment of the present disclosure.
Figure 13:
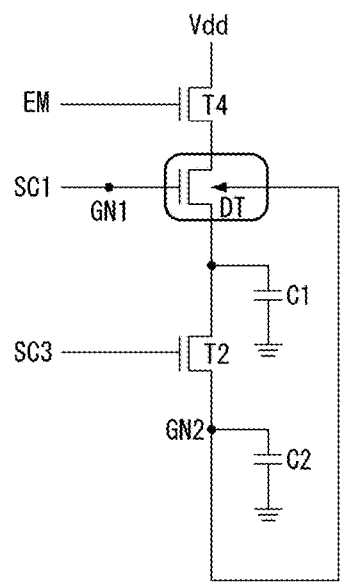
FIG. 13 is a view illustrating an equivalent circuit of a compensation circuit for compensating the threshold voltage of a driving TFT in the pixel configuration of FIG. 12.
Figure 14:
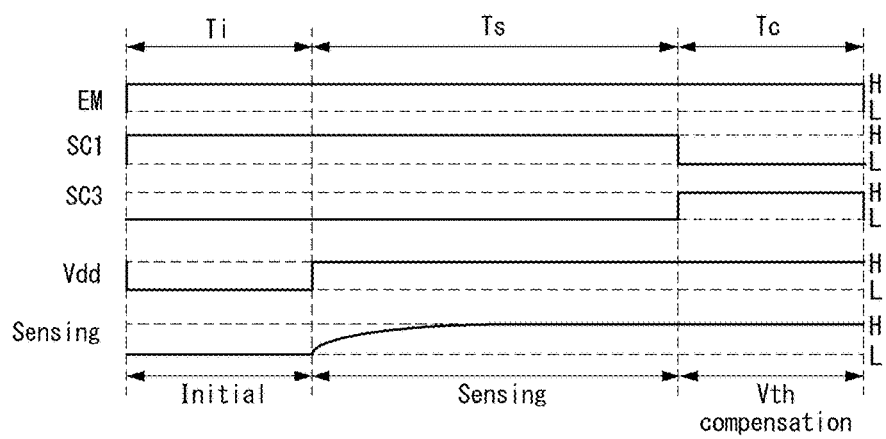
FIG. 14 is a view illustrating driving signals which are input to compensate the threshold voltage of the driving TFT in the pixel configuration of FIG. 12.

FIG. 12 is a view showing a connection configuration of a pixel PXL according to the second embodiment of the present disclosure. FIG. 13 is a view illustrating an equivalent circuit of a compensation circuit for compensating the threshold voltage of a driving TFT DT in the pixel configuration of FIG. 12. FIG. 14 is a view illustrating driving signals which are input to compensate the threshold voltage of the driving TFT DT in the pixel configuration of FIG. 12.

Referring to FIGS. 12 and 13, a pixel PXL of this disclosure comprises an organic light-emitting diode OLED, a plurality of TFTs (thin-film transistors) T1 to T4 and DT, and capacitors C1, C2, Cst, and Coled.

It should be noted that the embodiments of the present disclosure are not limited to organic light-emitting diode but may be applied to quantum dot emitting diode.

The first switching TFT T1 may be implemented as an oxide TFT with good off-current characteristics, and the driving TFT DT, too, may be implemented as an oxide TFT. The other TFTs T2 to T4 may be implemented as LTPS TFTS or oxide TFTs.

The driving TFT DT, whose threshold voltage is to be compensated, may be implemented as a double-gate TFT having a first gate node GN1 and a second gate node GN2.

The driving TFT DT is a driving element that adjusts the current flowing through the OLED according to the gate-source voltage Vgs. The OLED emits light by an electrical current, the amount of which is adjusted according to the gate-source voltage of the driving TFT DT.

The driving TFT DT may adjust the current flowing between the Vdd and the OLED according to a data signal Vdata input into the first gate node GN1. A high-level power supply voltage Vdd is supplied to the drain of the driving TFT DT. The source of the driving TFT DT is connected to the anode of the OLED. The third TFT T3 connects the initial line to which a reset voltage Vinit is applied and the anode of the OLED in response to a second scan signal SC 2. The light emission timing is adjusted as the driving TFT DT whose connection with the Vdd is controlled according to an emission signal EM.

For threshold voltage of the driving TFT DT compensation, the source of the driving TFT DT is connected to a first capacitor C1 that stores threshold voltage Vth of the driving TFT DT, and the second gate node GN2 of the driving TFT DT is connected to a second capacitor C2 that stores threshold voltage Vth.

A connection line of the first capacitor C1 and the second capacitor C2 may be connected or disconnected by a second switching TFT T2 that turns on/off by a third scan signal SC 3, whereby the threshold voltage Vth stored in the first capacitor C1 may move to the second capacitor C2 and be stored in it.

The threshold voltage compensation process may be implemented through a reset period Ti, a sensing period Ts subsequent to the reset period Ti, and a compensation period Tc subsequent to the sensing period Ts, as illustrated in FIG. 14.

In the reset period Ti, the emission signal EM is input at high level H, a first scan signal SC 1 is input at high level H, the third scan signal SC3 and the high-level operating voltage Vdd are input at low level L.

In the sensing period Ts, the emission signal EM is input at high level H, the first scan signal SC 1 is input at high level H, the third scan signal SC3 is input at low level L, and the high-level operating voltage Vdd is input at high level H. The sensing waveform is an illustration of the waveform of the threshold voltage Vth stored in the first capacitor C1.

In the compensation period Tc, the emission signal EM is input at high level H, the first scan signal SC 1 is input at low level L, the third scan signal SC3 is input at high level H, and the high-level operating voltage Vdd is input at high level H.

Here, the high level H is a voltage level that turns on NMOS-type oxide TFTs and at the same time turns off PMOS-type LTPS TFTs. On the other hand, the low level L is a voltage level that turns off NMOS-type oxide TFTs and at the same time turns on PMOS-type LTPS TFTs.

Figure 15:
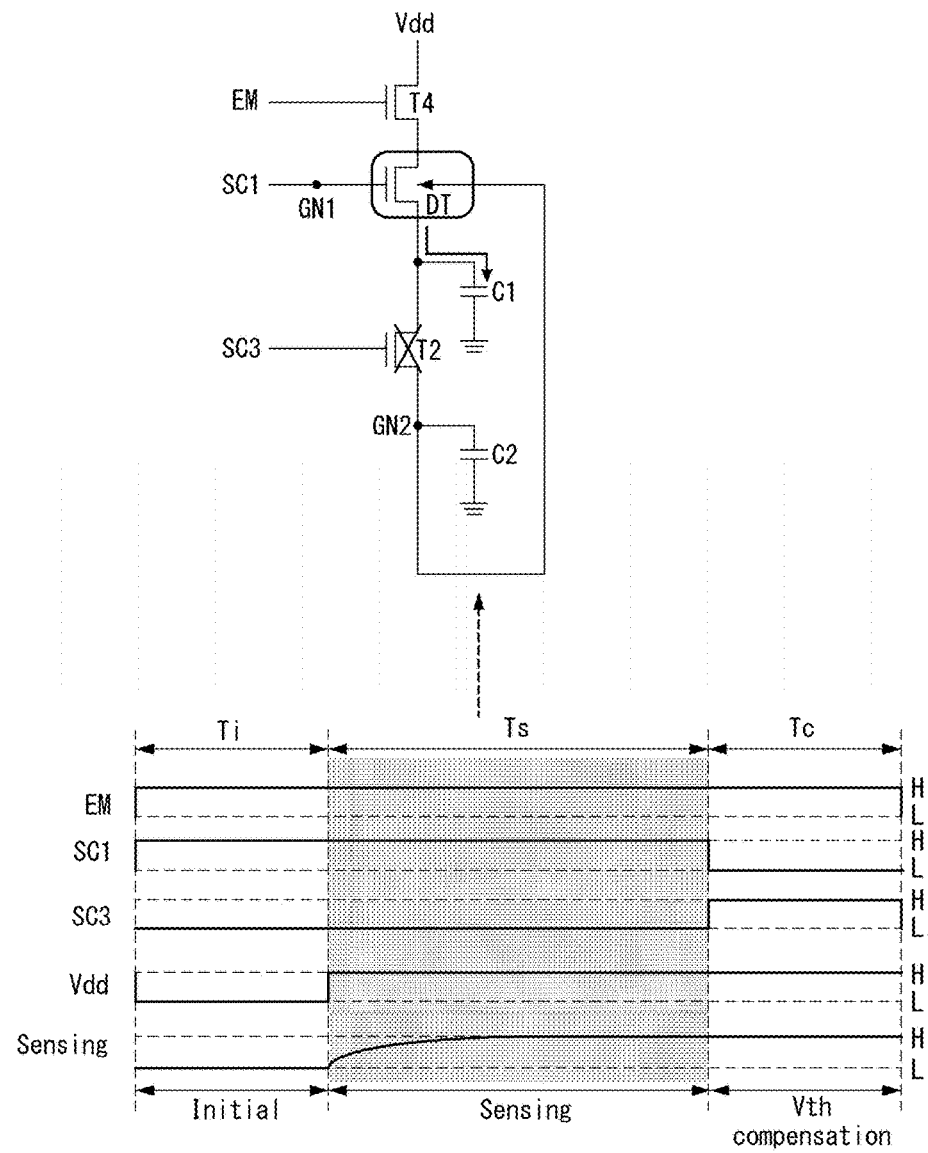
FIG. 15 is an equivalent circuit diagram of how the pixel works during the sensing period of FIG. 14.
Figure 16:
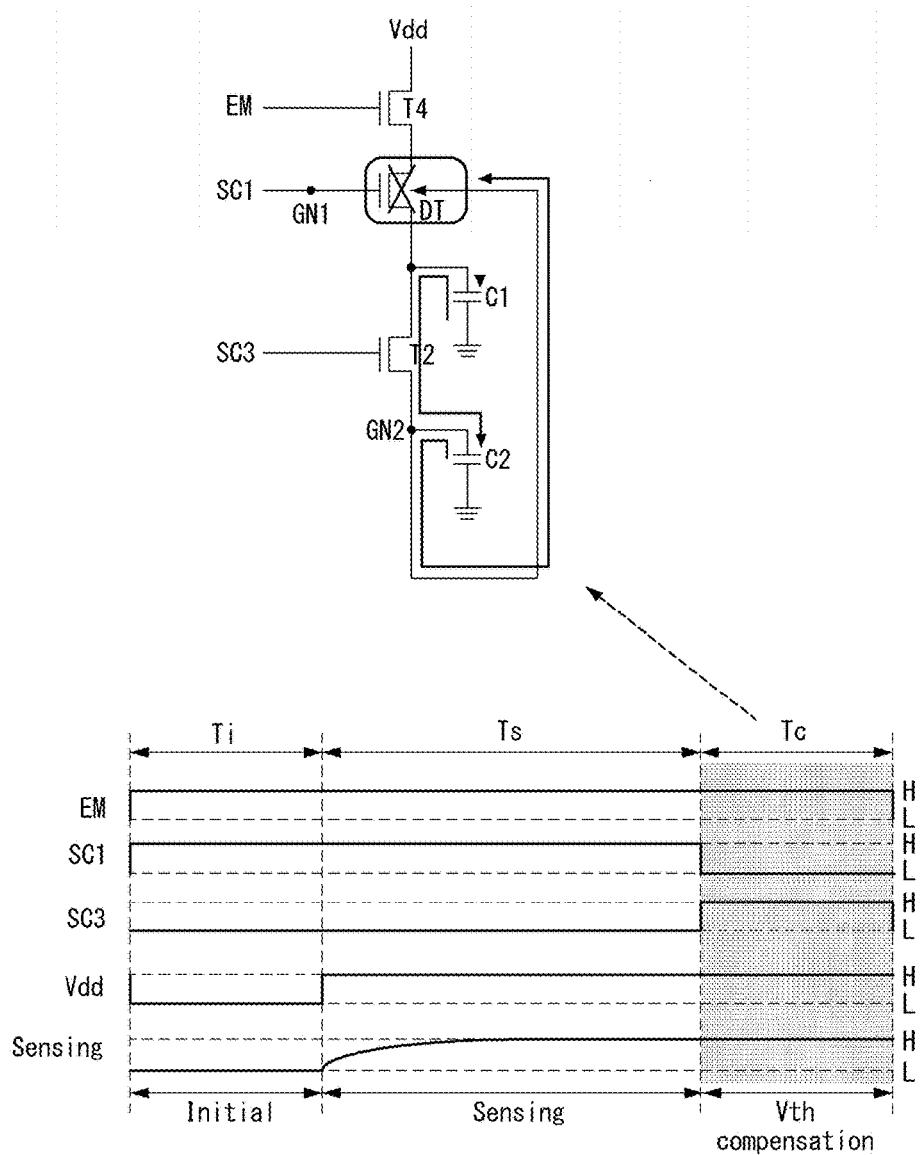
FIG. 16 is an equivalent circuit diagram of how the pixel works during the compensation period of FIG. 14.

FIGS. 15 and 16 are equivalent circuit diagrams of how the pixel PXL works during the reset period Ti, sensing period Ts, and compensation period Tc of FIG. 14.

In the reset period Ti, the driving TFT DT turns on as the emission signal EM is input at high level H and the first scan signal SC 1 is input at high level H. The second switching TFT T2 turns off as the third scan signal SC3 is input at low level L. The high-level operating voltage Vdd connected to the drain of the driving TFT DT is input at low level L, too. Thereby the first capacitor C1 and the second capacitor C2 are connected and resetting the power stored in the first capacitor C1 and second capacitor C2.

Referring to FIG. 15, in the sensing period Ts, Vdd is supplied as the emission signal EM is input at high level H, and the driving TFT DT turns on as the first scan signal SC 1 is input at high level H. The second switching TFT T2 turns off as the third scan signal SC3 is input at low level L.

As a result, a Vdd signal is applied to the source node of the driving TFT DT. The driving TFT DT operates as a source follower, and threshold voltage Vth is sensed and stored in the first capacitor C1.

In detail, when the Vdd signal, higher than the reset voltage, is applied to the source node of the driving TFT DT current flows through the driving TFT DT. Due to this current, the electrical potential of the first capacitor C1 is rising. When the electrical potential of the gate-source voltage of the driving TFT DT becomes equal to the threshold voltage Vth of the driving TFT DT, and the driving TFT DT turns off. At the point in time when the driving TFT DT turns off, the electrical potential of the first capacitor C1 is stored as the threshold voltage Vth of the driving TFT DT.

Referring to FIG. 16, in the compensation period Tc, the driving TFT turns off as the emission signal EM is input at high level H and the first scan signal SC 1 is input at low level L. The second switching TFT T2 turns on as the third scan signal SC3 is input at high level H.

Therefore, the threshold voltage Vth stored in the first capacitor C1 moves to the second capacitor C2 through the second switching TFT T2. After moving to the second capacitor C2, the threshold voltage Vth is input into the second gate node GN2 of the driving TFT DT, thereby compensating the threshold voltage of the driving TFT DT. The threshold voltage compensation process may be performed at regular intervals set at the time of system design. For instance, this process may be performed at intervals of a specific number of frames, when turning on/off the display device, or at regular time intervals.

As explained above, the present disclosure exemplifies a method that compensates threshold voltage by implementing a TFT whose threshold voltage is to be compensated for example, an oxide TFT—as a double-gate TFT, in which one gate is used for driving the pixel PXL and the other gate is applied with a voltage for threshold voltage compensation. By connecting a power supply for compensation to a gate of the double-gate TFT, the threshold voltage of this TFT is shifted in the reverse direction of the characteristic curve, thereby compensating the threshold voltage.

Meanwhile, the double-gate TFT applied to the present disclosure may be implemented by using a well-known method of forming a double-gate TFT, and the double-gate TFT may have various structures, such as an etch stopper structure, an inverted coplanar structure, and a coplanar structure, depending on the TFT formation process.

Figure 17:
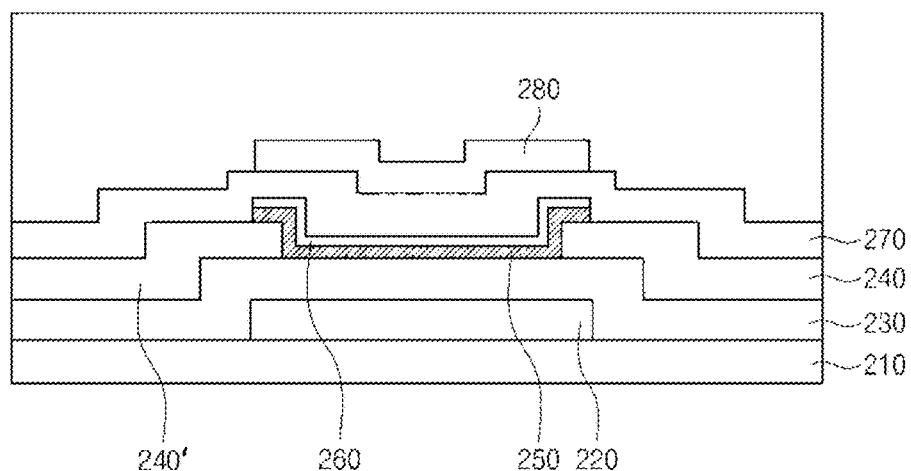
FIGS. 17 and 18 are views illustrating a TFT with double gates applicable to the present disclosure.
Figure 18:
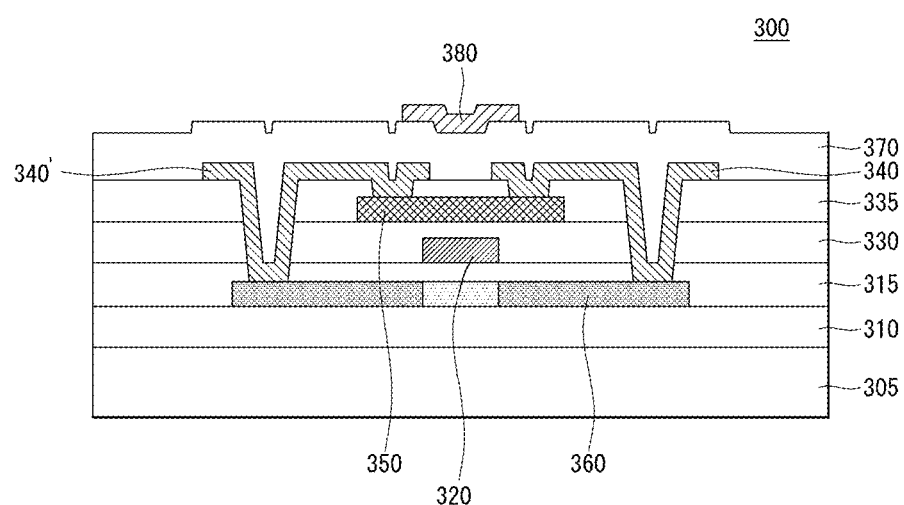

FIGS. 17 and 18 are views illustrating a structure of a double-gate TFT applicable to the present disclosure.

Referring to FIG. 17, a double-gate TFT 200 applicable to the present disclosure may have a bottom gate 220 on a substrate 210 (e.g., glass). Also, the double-gate TFT 200 may have an insulating film 230 (e.g., aluminum oxide) that can insulate the substrate 210 and the bottom gate 220 from overlying material. Also, a drain 240 and a source 240' are formed, and then an active layer 250 may be formed in which an electron or hole transporting channel is formed. Afterwards, a protection layer 260 may be formed to prevent damage caused by etching, and then another insulating layer 270 (e.g., aluminum oxide) may be formed. Also, a top gate 280 that can adjust the channel width of the active layer 250 as the bottom gate 220 does may be formed on the insulating film 270.

The first switching TFT T1 and driving TFT DT according to an embodiment of the present disclosure may be configured as the above-described double-gate TFT. Thus, in order to compensate for a shift in an undesired direction in the threshold voltage of an oxide TFT, the circuit may be configured in such a way as to apply threshold voltage Vth to the top gate 280 or the bottom gate 220. A simple circuit comprising two capacitors C1 and C2 and a second switching TFT T2 may be configured to store and apply the threshold voltage Vth.

FIG. 18 illustrates a double-gate TFT with another structure applicable to the present disclosure.

Referring to FIG. 18, a buffer layer 310 is formed on a substrate 305 (e.g., glass or plastic), and then a first active layer 360 is formed. The first active layer 360 may be formed of LTPS or oxide.

A first insulating film 315 (e.g., silicon insulating film or aluminum oxide) may be formed on the buffer layer 310 and the first active layer 360 to insulate them from overlying material. A bottom gate 320 may be formed on the first insulating film 315. Also, a second insulating film 330 (e.g., silicon insulating film or aluminum oxide) may be formed to insulate the first insulating film 315 and the bottom gate 320 from overlying material.

A second active layer 350 is formed on the second insulating film 330. The second active material 350 is formed of a different material than the first active layer 360. For instance, if the first active layer 360 is formed of LTPS, the second active layer 350 may be formed of oxide. If the first active layer 360 is formed of oxide, the second active layer 350 may be formed of LTPS.

Afterwards, a third insulating film 335 is formed and then etched to form a drain 340 and a source 340' that are connected to the first active layer 360 and the second active layer 350. Thus, an electron or hole transporting channel may be formed in the first active layer 360 and second active layer 350.

Afterwards, another insulating film 370 (e.g., silicon insulating film or aluminum oxide) may be formed, and a top gate 380 that can adjust the channel width of the second active layer 350 as the bottom gate 220 does may be formed on the insulating film 370. That is, the second active layer 350 may be configured in a double-gate structure. When it is desired to configure the first active layer 360 in a double-gate structure, a gate that can adjust the channel width of the first active layer 360 may be formed on the buffer layer 310 and the substrate 305.

As explained above, a double-gate TFT according to the present disclosure may comprise both an active region formed of oxide and an active region formed of LTPS. Accordingly, at least one between the LTPS active region and the oxide active region may be selected and used as the double-gate TFT. However, the present disclosure is not limited to this but may include a modification in which the top gate 380 is disposed on the back side of the buffer layer 310 to correspond to the first active layer 360.

A display device according to an embodiment of the present disclosure may be described as follows.

A display device according to the present disclosure comprises a display device in which each subpixel comprises a driving TFT, an organic light-emitting diode, and at least one switching TFT for driving the subpixel. At least one of the driving TFT and the switching TFT is formed as a double-gate TFT having a first gate node and a second gate node, and each subpixel comprises a compensation circuit that senses a threshold voltage of the double-gate TFT and applies the threshold voltage to the first gate node or the second gate node of the double-gate TFT.

According to one or more embodiments, the compensation circuit may comprise a first capacitor that stores the threshold voltage of the double-gate TFT, a second capacitor that is connected to the first gate node or second gate node of the double-gate TFT and stores the threshold voltage of the double-gate TFT to apply the threshold voltage stored in the first capacitor to the first gate node or second gate node, and a second switching TFT that turns on/off according to an external input signal, and that, when compensating the threshold voltage of the double-gate TFT, interconnects the first capacitor and the second capacitor to provide the threshold voltage stored in the first capacitor to the second capacitor.

According to one or more embodiments, the second switching TFT may turn on/off according to the external input signal, and disconnect the first capacitor and the second capacitor when the threshold voltage of the double-gate TFT is stored in the first capacitor.

According to one or more embodiments, among the at least one switching TFT for driving the subpixel, the first switching TFT may be formed as an N-type oxide double-gate TFT, and the first switching TFT may apply a data signal input through a data line to the gate of the driving TFT upon receipt of a first scan signal through the first gate node, and may be connected to the second capacitor through the second gate node to receive the threshold voltage.

According to one or more embodiments, the driving TFT may be formed as an N-type oxide double gate TFT, and the driving TFT may adjust the amount of electrical current applied to the organic light-emitting diode upon receipt of a data signal through the first gate node, and may be connected to the second capacitor through the second gate node to receive the threshold voltage.

According to one or more embodiments, the double-gate TFT may be formed as an oxide TFT.

According to one or more embodiments, the double-gate TFT may comprise two or more active regions. The two or more active regions may be formed of at least one of oxide and LTPS.

According to one or more embodiments, at least one of the driving TFT and the switching TFT may be implemented as an N-type oxide TFT, and the at least one switching TFT for driving the subpixel may be implemented as an N-type LTPS TFT, an N-type LTPS TFT, or a P-type LTPS TFT.

According to one or more embodiments, the compensation circuit may further comprise a third TFT for connecting an initial line to which a reset voltage may be applied and the anode of the organic light-emitting diode in response to a second scan signal.

According to one or more embodiments, the double-gate TFT may have one of an etch stopper structure, an inverted coplanar structure, and a coplanar structure.

According to one or more embodiments, the double-gate TFT may comprise a bottom gate on a substrate, an insulating film on the bottom gate and the substrate that insulates the substrate and the bottom gate, a drain and a source on the insulating film, an active layer on the insulating film and the drain and source, a protection layer on the active layer, another insulating layer on the protection layer and the drain and source, and a top gate on the insulating film.

According to one or more embodiments, the double-gate TFT may comprise a buffer layer on a substrate, a first active layer on the buffer layer and formed of LTPS or oxide, a first insulating film on the buffer layer and the first active layer, a bottom gate on the first insulating film, a second insulating film on the first insulating film and the bottom gate, a second active layer on the second insulating film formed of a different material than the first active layer, a third insulating film on the second active layer and the second insulating film, a drain and a source formed to be connected to the first active layer 360 and the second active layer, another insulating film on the third insulating film and the drain and source, and a top gate on the another insulating film.

A electroluminescent display with an organic light-emitting diodes in which each subpixel according to the present disclosure comprises a driving TFT that applies drive current to the organic light-emitting diode to cause the organic light-emitting diode to emit light, a first switching TFT that is connected to a gate of the driving TFT and applies a data signal input through a data line to the gate, and a plurality of switching TFTs that are for turning on/off the driving TFT. At least one of the driving TFT and the switching TFT is formed as a double-gate TFT having a first gate node and a second gate node, and each subpixel comprises a compensation circuit that senses the threshold voltage of the double-gate TFT and applies the same to the first gate node or second gate node of the double-gate TFT.

According to one or more embodiments, the compensation circuit may comprise a first capacitor that stores the threshold voltage of the double-gate TFT, a second capacitor that is connected to the first gate node or second gate node of the double-gate TFT and stores the threshold voltage to apply the threshold voltage stored in the first capacitor to the connected gate node, a second switching TFT that turns on/off according to an external input signal, that disconnects the first capacitor and the second capacitor when the threshold voltage of the double-gate TFT is stored in the first capacitor, and that, when compensating the threshold voltage of the double-gate TFT, interconnects the first capacitor and the second capacitor to provide the threshold voltage stored in the first capacitor to the second capacitor.

According to one or more embodiments, the first switching TFT may be formed as an N-type oxide double-gate TFT, and the first switching TFT may apply a data signal input through a data line to a gate of the driving TFT upon receipt of a first scan signal through the first gate node, and is connected to the second capacitor through the second gate node to receive the threshold voltage.

According to one or more embodiments, the driving TFT may be formed as an N-type oxide double gate TFT, and the driving TFT may adjust the amount of electrical current applied to the organic light-emitting diode upon receipt of a data signal through the first gate node, and may be connected to the second capacitor through the second gate node to receive the threshold voltage.

According to one or more embodiments, the double-gate TFT may be formed as an oxide TFT.

According to one or more embodiments, at least one of the driving TFT and the switching TFT may be implemented as an N-type oxide TFT, and the at least one switching TFT for driving the subpixel may be implemented as an N-type LTPS TFT, an N-type LTPS TFT, or a P-type LTPS TFT.

According to one or more embodiments, the compensation circuit may further comprise a third TFT for connecting an initial line to which a reset voltage may be applied and the anode of the organic light-emitting diode in response to a second scan signal.

According to one or more embodiments, the double-gate TFT may have one of an etch stopper structure, an inverted coplanar structure, and a coplanar structure.

According to one or more embodiments, the double-gate TFT may comprise a bottom gate on a substrate, an insulating film on the bottom gate and the substrate that insulates the substrate and the bottom gate, a drain and a source on the insulating film, an active layer on the insulating film and the drain and source, a protection layer on the active layer, another insulating layer on the protection layer and the drain and source, and a top gate on the insulating film that adjusts the channel width of the active layer as the bottom gate.

According to one or more embodiments, the double-gate TFT may comprise a buffer layer on a substrate, a first active layer on the buffer layer formed of LTPS or oxide, a first insulating film formed on the buffer layer and the first active layer, a bottom gate on the first insulating film, a second insulating film on the first insulating film and the bottom gate, a second active layer on the second insulating film formed of a different material than the first active layer, a third insulating film on the second active layer and the second insulating film, a drain and a source formed to be connected to the first active layer 360 and the second active layer, another insulating film on the third insulating film and the drain and source, and a top gate on the another insulating film that adjusts the channel width of the second active layer as the bottom gate.

A method of compensating for deterioration of a display device in which each subpixel comprises a driving TFT, an organic light-emitting diode, and at least one switching TFT for driving the subpixel, the method according to the present disclosure comprises turning off a first gate of a TFT whose threshold voltage is to be compensated so that the TFT operates as a source follower and the threshold voltage sensing power of the TFT is stored, the TFT whose threshold voltage may be to be compensated is formed as a double-gate TFT having a first gate node and a second gate node, and applying the threshold voltage sensing power to a second gate of the TFT whose threshold voltage is to be compensated.

It will be apparent to those skilled in the art that various modifications and variations can be made in the display device and the method of compensating for deterioration of the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device in which each subpixel comprises a driving TFT, an organic light-emitting diode, and at least one switching TFT for driving the subpixel,
    wherein at least one of the driving TFT and the switching TFT is formed as a double-gate TFT having a first gate node and a second gate node, and each subpixel comprises a compensation circuit that senses a threshold voltage of the double-gate TFT and applies the threshold voltage to the first gate node or the second gate node of the double-gate TFT,
    wherein the compensation circuit comprises:
        a first capacitor that stores the threshold voltage of the double-gate TFT;
        a second capacitor that is connected to the first gate node or second gate node of the double-gate TFT and stores the threshold voltage of the double-gate TFT to apply the threshold voltage stored in the first capacitor to the first gate node or second gate node; and
        a second switching TFT that turns on/off according to an external input signal, and that, when compensating the threshold voltage of the double-gate TFT, interconnects the first capacitor and the second capacitor to provide the threshold voltage stored in the first capacitor to the second capacitor.

2. The display device of claim 1, wherein the second switching TFT disconnects the first capacitor and the second capacitor when the threshold voltage of the double-gate TFT is stored in the first capacitor.

3. The display device of claim 1, wherein, among the at least one switching TFT for driving the subpixel, the first switching TFT is formed as an N-type oxide double-gate TFT, and the first switching TFT applies a data signal input through a data line to the gate of the driving TFT upon receipt of a first scan signal through the first gate node, and is connected to the second capacitor through the second gate node to receive the threshold voltage.

4. The display device of claim 1, wherein the driving TFT is formed as an N-type oxide double gate TFT, and the driving TFT adjusts the amount of electrical current applied to the organic light-emitting diode upon receipt of a data signal through the first gate node, and is connected to the second capacitor through the second gate node to receive the threshold voltage.

5. The display device of claim 1, wherein the double-gate TFT is formed as an oxide TFT.

6. The display device of claim 1, wherein the double-gate TFT comprises two or more active regions,
    wherein the two or more active regions are formed of at least one of oxide and LTPS.

7. The display device of claim 1, wherein at least one of the driving TFT and the switching TFT is implemented as an N-type oxide TFT, and the at least one switching TFT for driving the subpixel is implemented as an N-type LTPS TFT, an N-type LTPS TFT, or a P-type LTPS TFT.

8. The display device of claim 1, wherein the compensation circuit further comprises:
    a third TFT for connecting an initial line to which a reset voltage is applied and the anode of the organic light-emitting diode in response to a second scan signal.

9. The display device of claim 1, wherein the double-gate TFT has one of an etch stopper structure, an inverted coplanar structure, and a coplanar structure.

10. The display device of claim 1, wherein the double-gate TFT comprises:
    a bottom gate on a substrate;
    an insulating film on the bottom gate and the substrate that insulates the substrate and the bottom gate;
    a drain and a source on the insulating film;
    an active layer on the insulating film and the drain and source;
    a protection layer on the active layer;
    another insulating layer on the protection layer and the drain and source; and
    a top gate on the insulating film.

11. The display device of claim 1, wherein the double-gate TFT comprises:
a buffer layer on a substrate;
a first active layer on the buffer layer and formed of LTPS or oxide;
a first insulating film on the buffer layer and the first active layer;
a bottom gate on the first insulating film;
a second insulating film on the first insulating film and the bottom gate;
a second active layer on the second insulating film formed of a different material than the first active layer;
a third insulating film on the second active layer and the second insulating film;
a drain and a source formed to be connected to the first active layer and the second active layer;
another insulating film on the third insulating film and the drain and source; and
a top gate on the another insulating film.

12. An electroluminescent display with an organic light-emitting diode in which each subpixel comprises:
a driving TFT that applies drive current to the organic light-emitting diode to cause the organic light-emitting diode to emit light;
a first switching TFT that is connected to a gate of the driving TFT and applies a data signal input through a data line to the gate; and
a plurality of switching TFTs that are for turning on/off the driving TFT,
wherein at least one of the driving TFT and the switching TFT is formed as a double-gate TFT having a first gate node and a second gate node, and each subpixel comprises a compensation circuit that senses the threshold voltage of the double-gate TFT and applies the same to the first gate node or second gate node of the double-gate TFT,
wherein the compensation circuit comprises:
a first capacitor that stores the threshold voltage of the double-gate TFT;
a second capacitor that is connected to the first gate node or second gate node of the double-gate TFT and stores the threshold voltage to apply the threshold voltage stored in the first capacitor to the connected gate node; and
a second switching TFT that turns on/off according to an external input signal, that disconnects the first capacitor and the second capacitor when the threshold voltage of the double-gate TFT is stored in the first capacitor, and that, when compensating the threshold voltage of the double-gate TFT, interconnects the first capacitor and the second capacitor to provide the threshold voltage stored in the first capacitor to the second capacitor.

13. The electroluminescent display of claim 12, wherein the first switching TFT is formed as an N-type oxide double-gate TFT, and the first switching TFT applies a data signal input through a data line to a gate of the driving TFT upon receipt of a first scan signal through the first gate node, and is connected to the second capacitor through the second gate node to receive the threshold voltage.

14. The electroluminescent display of claim 12, wherein the driving TFT is formed as an N-type oxide double gate TFT, and the driving TFT adjusts the amount of electrical current applied to the organic light-emitting diode upon receipt of a data signal through the first gate node, and is connected to the second capacitor through the second gate node to receive the threshold voltage.

15. The electroluminescent display of claim 12, wherein the double-gate TFT is formed as an oxide TFT.

16. The electroluminescent display of claim 12, wherein at least one of the driving TFT and the switching TFT is implemented as an N-type oxide TFT, and
the at least one switching TFT for driving the subpixel is implemented as an N-type LTPS TFT, an N-type LTPS TFT, or a P-type LTPS TFT.

17. The electroluminescent display of claim 12, wherein the compensation circuit further comprises:
a third TFT for connecting an initial line to which a reset voltage is applied and the anode of the organic light-emitting diode in response to a second scan signal.

18. The electroluminescent display of claim 12, wherein the double-gate TFT has one of an etch stopper structure, an inverted coplanar structure, and a coplanar structure.

19. The electroluminescent display of claim 12, wherein the double-gate TFT comprises:
a bottom gate on a substrate;
an insulating film on the bottom gate and the substrate that insulates the substrate and the bottom gate;
a drain and a source on the insulating film;
an active layer on the insulating film and the drain and source;
a protection layer on the active layer;
another insulating layer on the protection layer and the drain and source; and
a top gate on the insulating film that adjusts the channel width of the active layer as the bottom gate.

20. The electroluminescent display of claim 12, wherein the double-gate TFT comprises:
a buffer layer on a substrate;
a first active layer on the buffer layer formed of LTPS or oxide;
a first insulating film formed on the buffer layer and the first active layer;
a bottom gate on the first insulating film;
a second insulating film on the first insulating film and the bottom gate;
a second active layer on the second insulating film formed of a different material than the first active layer;
a third insulating film on the second active layer and the second insulating film;
a drain and a source formed to be connected to the first active layer and the second active layer;
another insulating film on the third insulating film and the drain and source; and
a top gate on the another insulating film that adjusts the channel width of the second active layer as the bottom gate.

* * * * *